(12) United States Patent
Li

(10) Patent No.: US 11,056,543 B2
(45) Date of Patent: Jul. 6, 2021

(54) DISPLAY PANEL AND MANUFACTURING METHOD THEREOF

(71) Applicant: WUHAN CHINA STAR OPTOELECTRONICS SEMICONDUCTOR DISPLAY TECHNOLOGY CO., LTD., Wuhan (CN)

(72) Inventor: Yuanhang Li, Wuhan (CN)

( * ) Notice: Subject to any disclaimer, the term of this patent is extended or adjusted under 35 U.S.C. 154(b) by 57 days.

(21) Appl. No.: 16/613,418

(22) PCT Filed: Sep. 20, 2019

(86) PCT No.: PCT/CN2019/107050
§ 371 (c)(1),
(2) Date: Nov. 14, 2019

(87) PCT Pub. No.: WO2020/237930
PCT Pub. Date: Dec. 3, 2020

(65) Prior Publication Data
US 2021/0126061 A1 Apr. 29, 2021

(30) Foreign Application Priority Data
May 30, 2019 (CN) .......................... 201910460034.1

(51) Int. Cl.
*G06F 3/044* (2006.01)
*H01L 27/32* (2006.01)
(Continued)

(52) U.S. Cl.
CPC ........ *H01L 27/3216* (2013.01); *G06F 3/0412* (2013.01); *G06F 3/0443* (2019.05);
(Continued)

(58) Field of Classification Search
CPC . G06F 2203/04103; G06F 2203/04111; G06F 3/0412; G06F 3/0443;
(Continued)

(56) References Cited

U.S. PATENT DOCUMENTS 10,141,541 B1* 11/2018 Li ........................ H01L 51/529
2012/0098022 A1* 4/2012 Jan ...................... H01L 51/5253
257/99

(Continued)

FOREIGN PATENT DOCUMENTS

| CN | 104678639 A | 6/2015 |
|---|---|---|
| CN | 106098742 A | 11/2016 |

(Continued)

*Primary Examiner* — Tony O Davis

(57) ABSTRACT

The present invention provides a display panel and a manufacturing method thereof, the display panel includes a packaging structure, and the packaging structure includes a first inorganic layer, a color filter layer, a second inorganic layer. The color filter layer is disposed between the first inorganic layer and the second inorganic layer, and the color filter layer includes a red photoresist, a green photoresist, and a blue photoresist; and the red photoresist is disposed on a light-emitting side of the red light-emitting pixels, the green photoresist is disposed on a light-emitting side of the green light-emitting pixels, and the blue photoresist is disposed on a light-emitting side of the blue light-emitting pixels.

16 Claims, 3 Drawing Sheets

(51) Int. Cl.
*G06F 3/041* (2006.01)
*H01L 51/56* (2006.01)

(52) U.S. Cl.
CPC .......... *H01L 27/322* (2013.01); *H01L 27/323* (2013.01); *H01L 51/56* (2013.01); *G06F 2203/04103* (2013.01); *G06F 2203/04111* (2013.01); *H01L 2227/323* (2013.01)

(58) Field of Classification Search
CPC ........... H01L 2227/323; H01L 27/3216; H01L 27/322; H01L 27/323; H01L 51/56
See application file for complete search history.

(56) References Cited

U.S. PATENT DOCUMENTS

| | | | | |
|---|---|---|---|---|
| 2015/0076474 | A1* | 3/2015 | Kao | H01L 51/56 257/40 |
| 2016/0293897 | A1* | 10/2016 | Quan | H01L 51/56 |
| 2016/0342018 | A1 | 11/2016 | Xue et al. | |
| 2016/0372521 | A1* | 12/2016 | Gao | H01L 51/56 |
| 2017/0194595 | A1* | 7/2017 | Li | H01L 51/0003 |
| 2017/0352833 | A1* | 12/2017 | Yu | H01L 51/5253 |
| 2017/0358780 | A1* | 12/2017 | Li | H01L 51/56 |
| 2018/0095566 | A1 | 4/2018 | Lee et al. | |
| 2018/0175116 | A1 | 6/2018 | Song et al. | |
| 2018/0183005 | A1* | 6/2018 | Peng | H01L 51/5088 |
| 2018/0212187 | A1* | 7/2018 | Jin | H01L 51/5256 |
| 2018/0219178 | A1* | 8/2018 | Jin | H01L 51/56 |
| 2018/0323240 | A1 | 11/2018 | Won et al. | |
| 2018/0342563 | A1* | 11/2018 | You | H01L 51/56 |
| 2019/0165328 | A1* | 5/2019 | Yi | H01L 51/56 |
| 2019/0189964 | A1* | 6/2019 | Jin | H01L 51/5256 |
| 2019/0288243 | A1* | 9/2019 | Lv | H01L 51/56 |
| 2020/0044188 | A1* | 2/2020 | Li | H01L 51/5253 |
| 2020/0328374 | A1* | 10/2020 | Lv | H01L 51/5228 |

FOREIGN PATENT DOCUMENTS

| | | |
|---|---|---|
| CN | 107887409 A | 4/2018 |
| CN | 108874202 A | 11/2018 |

* cited by examiner

DISPLAY PANEL AND MANUFACTURING METHOD THEREOF

FIELD OF INVENTION

The present invention is related to the field of display technology, and specifically to a display panel and a manufacturing method thereof.

BACKGROUND OF INVENTION

Considering the bendability of the display panel, the prior art replaces the polarizer with the color filter in the Organic Light-emitting Diode (OLED) display panel.

In addition, the prior art of panels with an integrated touch function directly forms the touch structure on the packaging layer of the OLED panel, called the Direct On Cell Touch (DOT) structure. The DOT structure is light in weight and high in transmittance.

The prior display panel combines above two structures and uses the low-temperature process to form a touch structure, and then simply forms a color filter layer on the touch structure to produce an integrated display panel.

SUMMARY OF INVENTION

The present invention provides a display panel and a manufacturing method thereof to solve problems that the complex process and the low efficient of the prior integrated display panel.

The present invention provides a display panel, comprising:

an organic light-emitting structure layer, the organic light-emitting structure layer comprising red light-emitting pixels, green light-emitting pixels, and blue light-emitting pixels;

wherein the display panel comprises a packaging structure, and the packaging structure is formed on the organic light-emitting structure layer;

the packaging structure comprising:

a first inorganic layer formed on the organic light-emitting structure layer;

a color filter layer formed on the first inorganic layer, the color filter layer comprising a red photoresist, a green photoresist, and a blue photoresist;

a first flat layer formed on the color filter layer; and a second inorganic layer formed on the first flat layer;

wherein the red photoresist is disposed on a light-emitting side of the red light-emitting pixels, the green photoresist is disposed on a light-emitting side of the green light-emitting pixels, and the blue photoresist is disposed on a light-emitting side of the blue light-emitting pixels.

In the display panel of the present invention, wherein an orthographic projected area of the red light-emitting pixels in a plane of the color filter layer is less than or equal to an orthographic projected area of the red photoresist in the plane of the color filter layer, an orthographic projected area of the green light-emitting pixels in the plane of the color filter layer is less than or equal to an orthographic projected area of the green photoresist in the plane of the color filter layer, and an orthographic projected area of the blue light-emitting pixels in the plane of the color filter layer is less than or equal to an orthographic projected area of the blue photoresist in the plane of the color filter layer.

In the display panel of the present invention, wherein the display panel comprises a touch structure, and the touch structure is formed on the packaging structure;

the touch structure comprising:

a patterned touch metal layer disposed on the second inorganic layer;

a patterned first black photoresist layer disposed on the touch metal layer;

a second flat layer formed on the second inorganic layer and covers the touch metal layer and the first black photoresist layer;

a patterned bridge layer disposed on the second flat layer;

a patterned second black photoresist layer disposed on the bridge layer; and a protection layer formed on the second flat layer and covers the bridge layer and the second black photoresist layer;

wherein the first black photoresist layer and the second black photoresist layer forms a black shading network, and the black shading network disposed beyond the red photoresist, the green photoresist, and the blue photoresist of the color filter layer.

In the display panel of the present invention, wherein the touch metal layer comprises a plurality of first electrodes, and neighboring two first electrodes are spaced with each other;

wherein the touch structure comprises a first through hole, and the first through hole passes through the second flat layer, the first black photoresist layer, and the first electrode; and wherein the bridge layer is formed on the second flat layer and fills the first through hole, and neighboring two first electrodes electrically connect each other through the bridge layer.

The present invention provides a manufacturing method of a display panel, wherein the display panel comprises an organic light-emitting structure layer, the organic light-emitting structure layer comprises red light-emitting pixels, green light-emitting pixels, blue light-emitting pixels, and the manufacturing method comprises a step of forming a packaging structure, the step of forming the packaging structure comprising the steps of:

forming a first inorganic layer on the organic light-emitting structure layer;

forming a color filter layer on the first inorganic layer, the color filter layer comprising a red photoresist, a green photoresist, and a blue photoresist;

forming a first flat layer on the first inorganic layer, and the first flat layer covering the color filter layer; and forming a second inorganic layer on the first flat layer;

wherein the red photoresist is disposed on a light-emitting side of the red light-emitting pixels, the green photoresist is disposed on a light-emitting side of the green light-emitting pixels, and the blue photoresist is disposed on a light-emitting side of the blue light-emitting pixels, and wherein an orthographic projected area of the red light-emitting pixels in a plane of the color filter layer is less than or equal to an orthographic projected area of the red photoresist in the plane of the color filter layer, an orthographic projected area of the green light-emitting pixels in the plane of the color filter layer is less than or equal to an orthographic projected area of the green photoresist in the plane of the color filter layer, and an orthographic projected area of the blue light-emitting pixels in the plane of the color filter layer is less than or equal to an orthographic projected area of the blue photoresist in the plane of the color filter layer; and wherein the manufacturing method further comprises a step of forming a touch structure, the step of forming the touch structure comprising the steps of:

forming a touch metal layer on the second inorganic layer;

forming a first black photoresist layer on the touch metal layer;

patterning the first black photoresist layer and the touch metal layer;

forming a second flat layer on the second inorganic layer, and the second flat layer covering a patterned first black photoresist layer and a patterned touch metal layer;

forming a bridge layer on the second flat layer;

forming a second black photoresist layer on the bridge layer;

patterning the second black photoresist layer and the bridge layer, the first black photoresist layer and the second black photoresist layer forming a black shading network, and the black shading network disposed beyond the red photoresist, the green photoresist, and the blue photoresist of the color filter layer; and forming a protection layer on the second flat layer, and the protection layer covering a patterned bridge layer and a patterned second black photoresist layer.

In the manufacturing method of the display panel of the present invention, wherein the color filter layer is formed on the first inorganic layer by an inkjet printing process.

In the manufacturing method of the display panel of the present invention, wherein patterning the first black photoresist layer and the touch metal layer comprises the steps of:

exposing and developing the first black photoresist layer with a first mask, and forming the patterned first black photoresist layer; and etching the touch metal layer, and forming a patterned touch metal layer.

In the manufacturing method of the display panel of the present invention, wherein the patterned touch metal layer comprises a plurality of first electrodes, and neighboring two first electrodes are spaced with each other; and wherein after forming the second flat layer, the manufacturing method further comprises the steps of:

forming a first hole portion by etching an area of the second flat layer corresponding to the first electrodes with a second mask;

forming a second hole portion by drily etching an area of the first black photoresist layer and the first electrodes corresponding to the first hole portion, and the first hole portion connecting the second hole portion to form a first through hole; and forming the bridge layer on the second flat layer, the bridge layer filling the first through hole, and neighboring two first electrodes electrically connecting each other through the bridge layer.

In the manufacturing method of the display panel of the present invention, wherein patterning the second black photoresist layer and the bridge layer comprises the steps of:

exposing and developing the second black photoresist layer with a third mask, and forming the patterned second black photoresist layer; and etching the bridge layer, and forming the patterned bridge layer.

In the manufacturing method of the display panel of the present invention, wherein forming the protection layer on the second flat layer with a fourth mask.

The present invention further provides a manufacturing method of a display panel wherein the display panel comprises an organic light-emitting structure layer, the organic light-emitting structure layer comprises red light-emitting pixels, green light-emitting pixels, blue light-emitting pixels, and the manufacturing method comprises a step of forming a packaging structure, the step of forming the packaging structure comprising the steps of:

forming a first inorganic layer on the organic light-emitting structure layer;

forming a color filter layer on the first inorganic layer, the color filter layer comprising a red photoresist, a green photoresist, and a blue photoresist;

forming a first flat layer on the first inorganic layer, and the first flat layer covering the color filter layer; and forming a second inorganic layer on the first flat layer;

wherein the red photoresist is disposed on a light-emitting side of the red light-emitting pixels, the green photoresist is disposed on a light-emitting side of the green light-emitting pixels, and the blue photoresist is disposed on a light-emitting side of the blue light-emitting pixels.

In the manufacturing method of the display panel of the present invention, wherein an orthographic projected area of the red light-emitting pixels in a plane of the color filter layer is less than or equal to an orthographic projected area of the red photoresist in the plane of the color filter layer, an orthographic projected area of the green light-emitting pixels in the plane of the color filter layer is less than or equal to an orthographic projected area of the green photoresist in the plane of the color filter layer, and an orthographic projected area of the blue light-emitting pixels in the plane of the color filter layer is less than or equal to an orthographic projected area of the blue photoresist in the plane of the color filter layer.

In the manufacturing method of the display panel of the present invention, wherein the color filter layer is formed on the first inorganic layer by an inkjet printing process.

In the manufacturing method of the display panel of the present invention, wherein the manufacturing method further comprises a step of forming a touch structure, the step of forming the touch structure comprising the steps of:

forming a touch metal layer on the second inorganic layer;

forming a first black photoresist layer on the touch metal layer;

patterning the first black photoresist layer and the touch metal layer;

forming a second flat layer on the second inorganic layer, and the second flat layer covering a patterned first black photoresist layer and a patterned touch metal layer;

forming a bridge layer on the second flat layer;

forming a second black photoresist layer on the bridge layer;

patterning the second black photoresist layer and the bridge layer, the first black photoresist layer and the second black photoresist layer forming a black shading network, and the black shading network disposed beyond the red photoresist, the green photoresist, and the blue photoresist of the color filter layer; and forming a protection layer on the second flat layer, and the protection layer covering a patterned bridge layer and a patterned second black photoresist layer.

In the manufacturing method of the display panel of the present invention, wherein patterning the first black photoresist layer and the touch metal layer comprises the steps of:

exposing and developing the first black photoresist layer with a first mask, and forming the patterned first black photoresist layer; and etching the touch metal layer, and forming a patterned touch metal layer.

In the manufacturing method of the display panel of the present invention, wherein the patterned touch metal layer comprises a plurality of first electrodes, and neighboring two first electrodes are spaced with each other; and wherein after forming the second flat layer, the manufacturing method further comprises the steps of:

forming a first hole portion by etching an area of the second flat layer corresponding to the first electrodes with a second mask;

forming a second hole portion by drily etching an area of the first black photoresist layer and the first electrodes corresponding to the first hole portion, and the first hole portion connecting the second hole portion to form a first through hole; and forming the bridge layer on the second flat layer, the bridge layer filling the first through hole, and neighboring two first electrodes electrically connecting each other through the bridge layer.

In the manufacturing method of the display panel of the present invention, wherein patterning the second black photoresist layer and the bridge layer comprises the steps of:

exposing and developing the second black photoresist layer with a third mask, and forming the patterned second black photoresist layer; and etching the bridge layer, and forming the patterned bridge layer.

In the manufacturing method of the display panel of the present invention, wherein forming the protection layer on the second flat layer with a fourth mask.

Comparing the display panels of the prior art, the display panel and a manufacturing method thereof of the present invention integrate the color filter layer into the normal packaging layer to form a packaging structure. First, the present invention thins the display panel. Second, the present invention reduces four mask processes due to the inkjet-printed color filter layer.

In addition, the touch structure of the present invention forms a black shading network with the first black photoresist layer and the second black photoresist layer to block the reflection of the metal lines and the cathode metal. The black shading network is disposed between the photoresists of the color filter layer likes a black matrix, and therefore reducing one mask process. The first black photoresist layer and the second black photoresist layer are respectively disposed on the touch metal layer and the bridge layer like a function that insulate the touch metal layer and the bridge layer, and therefore replacing the insulation layer and reducing a process of peeling off the first black photoresist layer and the second black photoresist layer. Consequently, the present invention solves problems that the complex process and the low efficient of the prior integrated display panel.

DESCRIPTION OF DRAWINGS

In order to describe technical solutions in the present invention clearly, drawings to be used in the description of embodiments will be described briefly below. Apparently, drawings described below are only for some embodiments of the present invention, and other drawings may be obtained by those skilled in the art based on these drawings without creative efforts.

DETAILED DESCRIPTION

Figure 1:
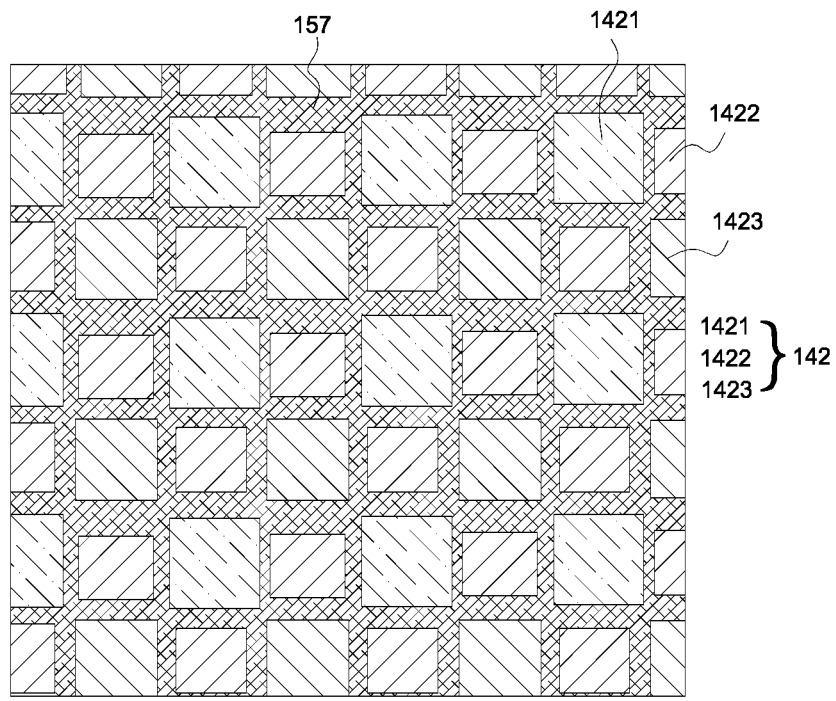
FIG. 1 is a structural diagram of a display panel according to an embodiment of the present invention.

Please refer to the drawings. Examples of the embodiments are shown in the drawings, and units of the same or similar functions are using the same or similar numeral to represent. Embodiments reference to the appended drawings are used to describe and understand the present invention, not to limit the present invention.

In the prior art, the OLED panel integrates the touch structure onto the color filter layer and integrates the color filter layer instead of the polarizer onto the packaging layer. Wherein, the color filter layer is integrated on the packaging layer, and the red photoresist, green photoresist, blue photoresist, the black matrix, and the first protection layer five-mask process are required. The touch structure is integrated on the color filter layer, and the first metal layer, the insulating layer, the second metal layer, and the second protection layer four-mask process are required. Thus, it needs nine processes to form an integrated OLED panel in the prior art.

Figure 2:
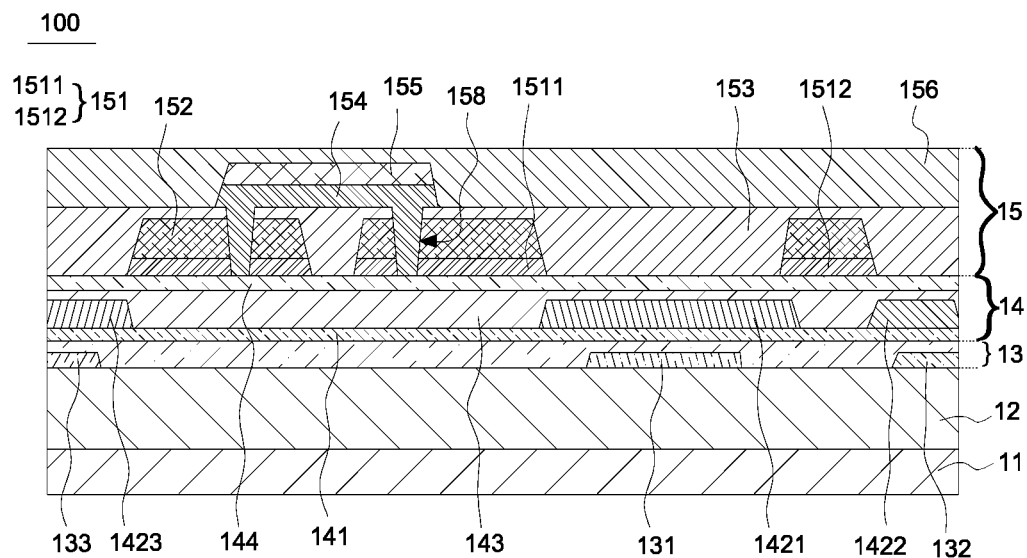
FIG. 2 is another structural diagram of the display panel according to the embodiment of the present invention.

Please refer to FIG. 1 and FIG. 2, FIG. 1 is a structural diagram of the embodiment of the display panel of the present invention, and FIG. 2 is another structural diagram of the embodiment of the display panel of the present invention.

Specifically, a display panel 100 includes a substrate 11, a thin film transistor array layer 12, an organic light-emitting structure layer 13, a packaging structure 14, and a touch structure 15. The substrate 11 can be a flexible substrate or a rigid substrate. The substrate 11 in the embodiment is a flexible substrate. The thin film transistor array layer 12 includes a driving circuit (not shown) for driving the organic light-emitting structure layer 13 light. The organic light-emitting structure layer 13 includes an anode (not shown), a pixel defining layer (not shown), red light-emitting pixels 131, green light-emitting pixels 132, blue light-emitting pixels 133, and a cathode (not shown). The thin film transistor array layer 12 and the organic light-emitting structure layer 13 are prior art and will not be described herein.

The packaging structure 14 in this embodiment is formed on the organic light-emitting structure layer 13. The packaging structure 14 includes a first inorganic layer 141, a color filter layer 142, a first flat layer 143, and a second inorganic layer 144.

The first inorganic layer 141 is formed on the organic light-emitting structure layer 13. The color filter layer 142 is formed on the first inorganic layer 141. The color filter layer 142 includes a red photoresist 1421, a green photoresist 1422, and a blue photoresist 1423. The first flat layer 143 is formed on the color filter layer 142. The second inorganic layer 144 is formed on the first flat layer 143.

The red photoresist 1421 is disposed on a light-emitting side of the red light-emitting pixels 131. The green photoresist 1422 is disposed on a light-emitting side of the green light-emitting pixels 132. The blue photoresist 1423 is disposed on a light-emitting side of the blue light-emitting pixels 133. The color filter layer is formed by an inkjet printing process.

Also, the color filter layer 142 is made of organic material, and so does the first flat layer 143. The first flat layer 143 is made for flattens and protects the color filter layer 142, thereby facilitating subsequent formation of the second inorganic layer 144. The color filter layer 142 and the first flat layer 143 replace the organic layer in the normal packaging layer. Consequently, the packaging structure 14 not only has the effect of packaging the display panel, but also has the function of a polarizer.

In the display panel 100 of this embodiment, an orthographic projected area of the red light-emitting pixels 131 in a plane of the color filter layer 142 is less than or equal to an orthographic projected area of the red photoresist 1421 in the plane of the color filter layer 142. An orthographic projected area of the green light-emitting pixels 132 in the plane of the color filter layer 142 is less than or equal to an orthographic projected area of the green photoresist 1422 in the plane of the color filter layer 142. An orthographic projected area of the blue light-emitting pixels 133 in the plane of the color filter layer 142 is less than or equal to an orthographic projected area of the blue photoresist 1423 in the plane of the color filter layer 142.

In this embodiment, each color light-emitting pixels is set with each color photoresists correspondingly to ensure the aperture ratio of each color light-emitting pixel is sufficiently large. For example, the red photoresist 1421 is disposed on a light-emitting side of the red light-emitting pixels 131 correspondingly, and it ensure the aperture ratio of red light-emitting pixels 131. The area of each color photoresists is greater than or equal to the area of each corresponding color light-emitting pixels, which ensures the filtering effect of the display panel 100.

The display panel 100 of this embodiment integrates the color filter layer 142 into the normal packaging layer and forms the packaging structure 14. First, it thins the display panel; second, the color filter layer 142 is formed by the inkjet-printing process. Comparing the prior art, it reduces four mask processes. The reduced four mask processes are red, green, blue, and protection layer mask processes. The color filter layer 142 of this embodiment integrates the black matrix into the touch structure 15.

In this embodiment, the touch structure 15 is formed on the packaging structure 14. The touch structure 15 includes a patterned touch metal layer 151, a patterned first black photoresist layer 152, a second flat layer 153, a patterned bridge layer 154, a patterned second black photoresist layer 155, and a protection layer 156.

Specifically, a patterned touch metal layer 151 is disposed on the second inorganic layer 144. The patterned first black photoresist layer 152 is disposed on the touch metal layer 151. The second flat layer 153 is formed on the second inorganic layer 144 and covers the touch metal layer 151 and the first black photoresist layer 152. The patterned bridge layer 154 is disposed on the second flat layer 153. The patterned second black photoresist layer 155 is disposed on the bridge layer 154. The protection layer 156 is formed on the second flat layer 153 and covers the bridge layer 154 and the second black photoresist layer 155.

The first black photoresist layer 152 and the second black photoresist layer 155 forms a black shading network 157. The black shading network 157 is disposed beyond the red photoresist 1421, the green photoresist 1422, and the blue photoresist 1423 of the color filter layer 142.

The first black photoresist layer 152 and the second black photoresist layer 155 can be a low-temperature negative photoresist or a black positive photoresist. The black shading network 157 not only effectively blocks the reflection of the metal lines and the underlying cathode metal, but also functions as a black matrix in the color filter layer 142.

In the process of forming the touch structure 15, forming a first metal layer on the second inorganic layer 144 first, then coating a layer of the first black photoresist on the first metal layer, then then forming a patterned first black photoresist layer 152 through the pre-drying process, exposure process, and development process, and last etching the first metal layer to form a patterned touch metal layer 151. Comparing the prior art, the present process does not peel off the first black photoresist 152 after forming the touch metal layer 151. Using the pattern of the first black photoresist 152 as an insulation layer of the touch metal layer 151 and the bridge layer 154, and blocking the touch metal layer 151. Similarly, in the process of forming the bridge layer 154, the second black photoresist 155 is not peeled off, and blocking the bridge layer 154.

In conclusion, the peeling process of manufacturing the touch metal layer 151 and the bridge layer 154 have been reduced due to the existence of the first black photoresist 152 and the second black photoresist 155. The first black photoresist 152 and the second black photoresist 155 respectively block the touch metal layer 151 and bridge layer 154, which can reduce the reflection of ambient light and the reflection of the metal lines, and optimize the optical effect. Last, the first black photoresist 152 and the second black photoresist 155 form the black shading network 157 and replace the black matrix of the color filter layer 142, and simplify the fabrication of the package structure 14.

The patterned touch metal layer 151 includes a plurality of first electrodes 1511 and a plurality of second electrodes 1512. Neighboring two first electrodes 1511 are spaced with each other. Neighboring two second electrodes 1512 are spaced with each other. The touch structure 15 includes a first through hole 158 and a second through hole (not shown).

The first through hole 158 passes through the second flat layer 153, the first black photoresist layer 152, and the first electrode 1511. The bridge layer 154 is formed on the second flat layer 153 and fills the first through hole 158, and neighboring two first electrodes 1511 electrically connect each other through the bridge layer 154.

The second through hole passes through the second flat layer 153, the first black photoresist layer 152, and the second electrode 1512. The bridge layer 154 is formed on the second flat layer 153 and fills the second through hole, and neighboring two second electrodes electrically connect each other through the bridge layer 154.

The second black photoresist layer 155 is made of organic material and disposed on the upper surface of the bridge layer 154, and the second flat layer 153 is made of organic material and disposed on the lower surface of the bridge layer 154, so that the bridge layer 154 is disposed between two organic layers. When the embodiment is in the bent state, the stress of the bridge layer 154 will be released by the second black photoresist layer 155 and the second flat layer 153, and prevent the bridge layer 154 damage. Also, the bridge layer 154 and the first electrode 1511 become a mortise and tenon structure since the first through hole 158 passes through the first electrode 1511 of the touch metal layer 151, which improves the stability.

The manufacturing method of the display of the present invention, please refer to the embodiment below.

Figure 3:
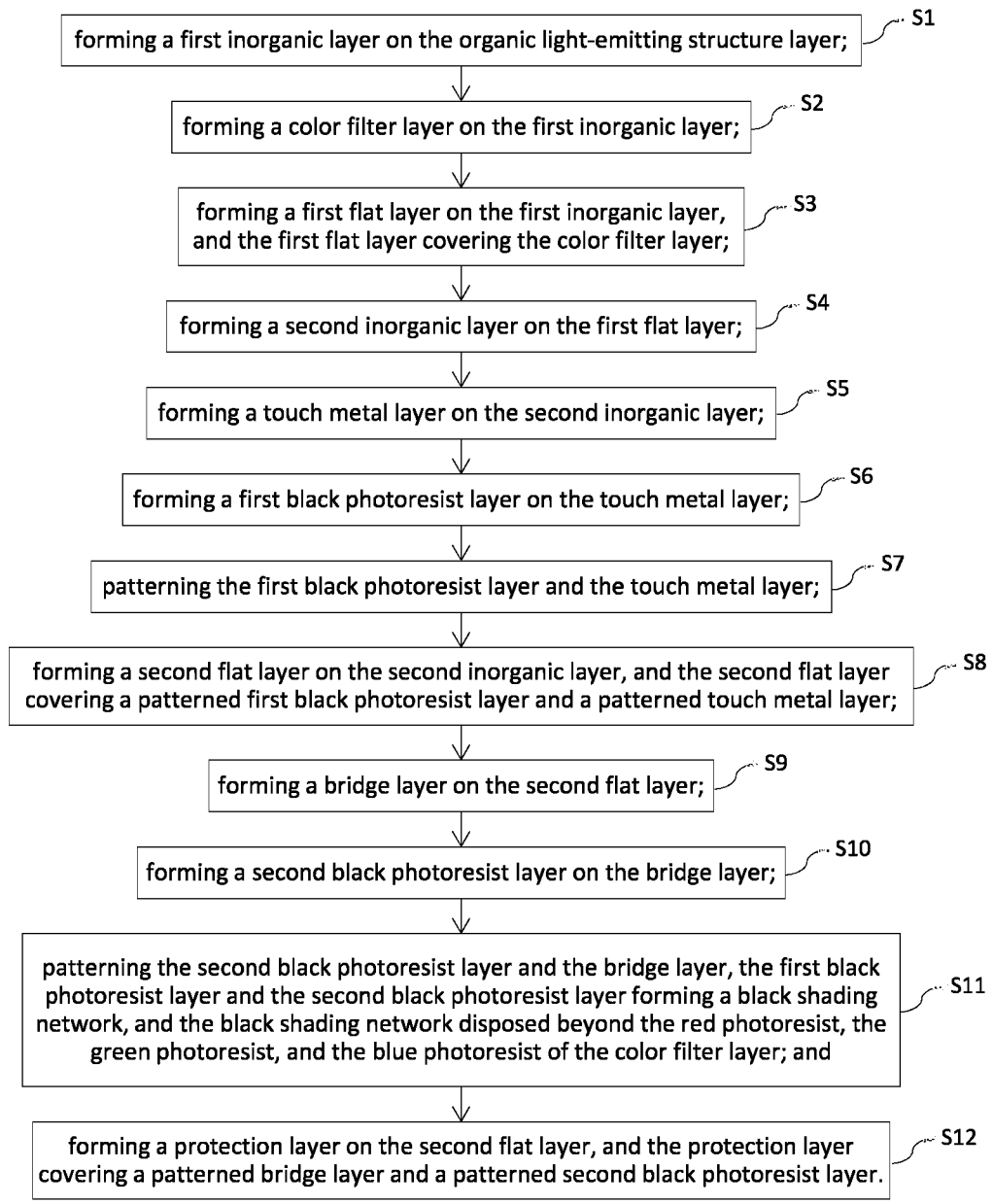
FIG. 3 is a flowchart of a manufacturing method of the display panel of the embodiment of the present invention.

Refer to the FIG. 3, which is a flowchart of a manufacturing method of the display panel of the embodiment of the present invention. It should be noted that the manufacturing method in the embodiment includes the step of forming the packaging structure 14 and the touch structure 15. Before forming the two structure, this manufacturing method has been finished the processes such as the substrate 11, the thin film transistor array layer 12, and the organic light-emitting structure layer 13. The organic light-emitting structure layer 13 includes red light-emitting pixels 131, green light-emitting pixels 132, and blue light-emitting pixels 133.

The steps of the manufacturing method in the embodiment includes the steps of forming the packaging structure 14 and the touch structure 15. The manufacturing method includes steps below:

step S1: forming a first inorganic layer on the organic light-emitting structure layer;

step S2: forming a color filter layer on the first inorganic layer;

step S3: forming a first flat layer on the first inorganic layer, and the first flat layer covering the color filter layer;

step S4: forming a second inorganic layer on the first flat layer;

step S5: forming a touch metal layer on the second inorganic layer;

step S6: forming a first black photoresist layer on the touch metal layer;

step S7: patterning the first black photoresist layer and the touch metal layer;

step S8: forming a second flat layer on the second inorganic layer, and the second flat layer covering a patterned first black photoresist layer and a patterned touch metal layer;

step S9: forming a bridge layer on the second flat layer;

step S10: forming a second black photoresist layer on the bridge layer;

step S11: patterning the second black photoresist layer and the bridge layer, the first black photoresist layer and the second black photoresist layer forming a black shading network, and the black shading network disposed beyond the red photoresist, the green photoresist, and the blue photoresist of the color filter layer; and step S12: forming a protection layer on the second flat layer, and the protection layer covering a patterned bridge layer and a patterned second black photoresist layer.

The step S1 to the step S4 is the steps for manufacture the packaging structure 14, and the step S5 to the step S12 is the steps for manufacture the touch structure 15. Two structures are specifically explained below.

Figure 4:
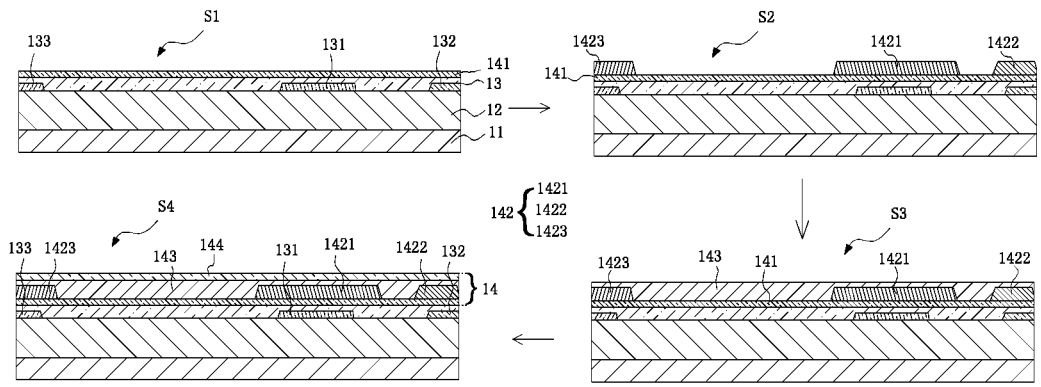
FIG. 4 is a flowchart that shows produce steps of a packaging structure of the manufacturing method of the display panel of the embodiment of the present invention.

Please refer to the FIG. 4, which is a flowchart that shows produce steps of a packaging structure of the manufacturing method of the display panel of the embodiment of the present invention. The steps for manufacture the packaging structure 14 are:

Step S1: forming a first inorganic layer 141 on the organic light-emitting structure layer 13. Material of the first inorganic layer 141 can be $SiN_x$ or $SiO_x$, and the thickness of it is between 1-2 microns. Then go on to the step S2.

Step S2: forming the color filter layer 142 on the first inorganic layer 141.

Specifically, using the inkjet printing process to produce the red photoresist 1421, the green photoresist 1422, and the blue photoresist 1423. The red photoresist 1421 is disposed on a light-emitting side of the red light-emitting pixels 131, the green photoresist 1422 is disposed on a light-emitting side of the green light-emitting pixels 132, and the blue photoresist 1423 is disposed on a light-emitting side of the blue light-emitting pixels 133.

An orthographic projected area of the red light-emitting pixels 131 in a plane of the color filter layer 142 is less than or equal to an orthographic projected area of the red photoresist 1421 in the plane of the color filter layer 142. An orthographic projected area of the green light-emitting pixels 132 in the plane of the color filter layer 142 is less than or equal to an orthographic projected area of the green photoresist 1422 in the plane of the color filter layer 142. An orthographic projected area of the blue light-emitting pixels 133 in the plane of the color filter layer 142 is less than or equal to an orthographic projected area of the blue photoresist 1423 in the plane of the color filter layer 142.

In this embodiment, each color light-emitting pixels is set with each color photoresists correspondingly to ensure the aperture ratio of each color light-emitting pixel is sufficiently large. For example, the red photoresist 1421 is disposed on a light-emitting side of the red light-emitting pixels 131 correspondingly, and it ensure the aperture ratio of red light-emitting pixels 131. The area of each color photoresists is greater than or equal to the area of each corresponding color light-emitting pixels, which ensures the filtering effect of the display panel 100.

The color filter layer 142 is integrated into the normal packaging layer to form a packaging structure 14 in the step S2. First, it thins the display panel. Second, it reduces four mask processes due to the inkjet-printed color filter layer. The reduced four mask processes are red, green, blue, and protection layer mask processes. The color filter layer 142 of this embodiment integrates the black matrix into the touch structure 15. Then go on to the step S3.

Step S3: forming a first flat layer 143 on the first inorganic layer 141. The first flat layer 143 covers the first inorganic layer 141 and the color filter layer 142. In the step S3, using the inkjet printing process to produce the first flat layer 143. The first flat layer 143 is made of organic material. The color filter layer 142 and the first flat layer 143 become a composite organic layer, and replace the organic layer in the normal packaging layer. Consequently, the packaging structure 14 not only has the effect of packaging the display panel, but also has the function of a polarizer and thins the display panel. Then go on to the step S4.

Step S4: forming a second inorganic layer 144 on the first flat layer 143. Material of the second inorganic layer 144 can be SiNx or SiOx. In this way, the process of the packaging structure 14 has been done. Then go on to the steps for manufacture the touch structure.

Figure 5:
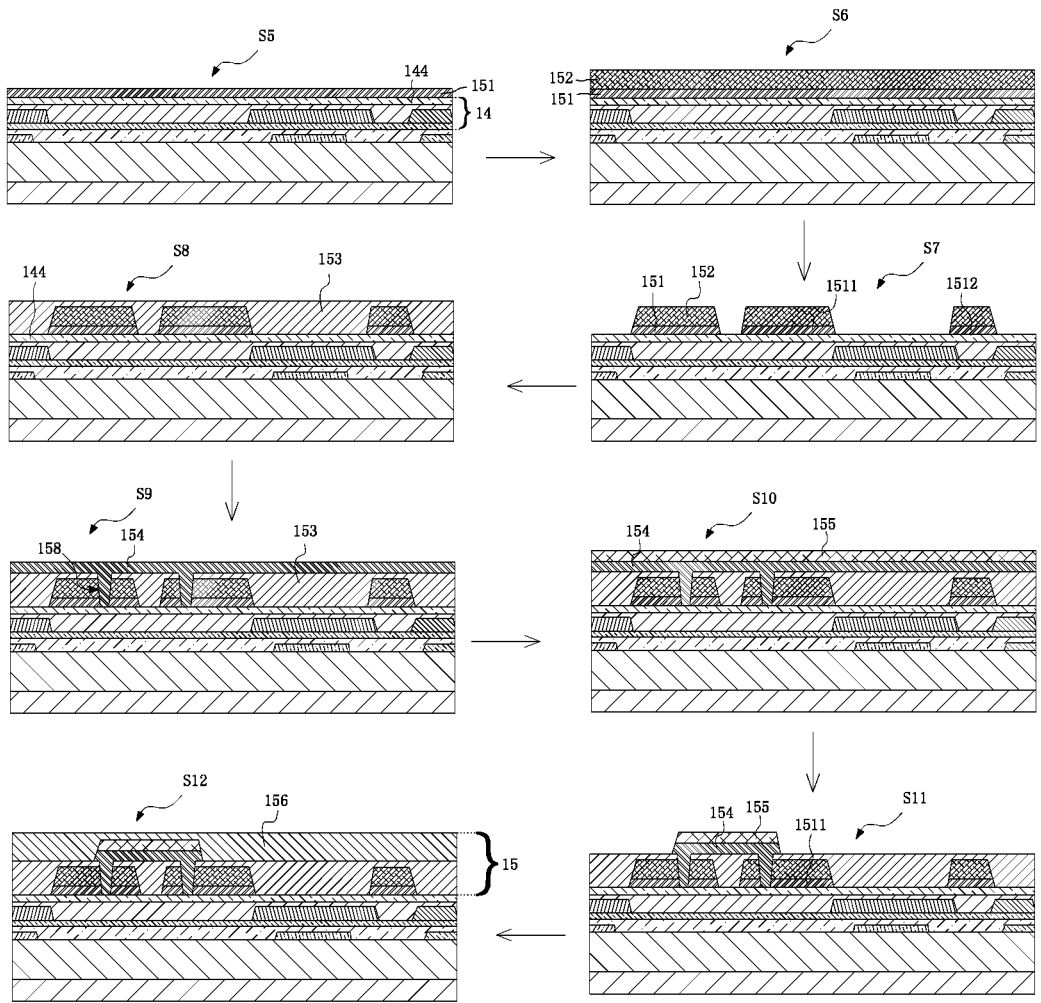
FIG. 5 is a flowchart that shows steps of a touch structure of the manufacturing method of the display panel of the embodiment of the present invention.

Please refer to the FIG. 5, which is a flowchart that shows produce steps of a touch structure of the manufacturing method of the display panel of the embodiment of the present invention. The steps for manufacture the touch structure 15 are:

Step S5: forming a touch metal layer 151 on the second inorganic layer 144. Material of the touch metal layer 151 can be a low-impedance and high-oxidation metal such as TiAlTi or Mo, or can also be a high transmittance conductive material such as indium tin oxide (ITO) or graphene. Then go on to the step S6.

Step S6: forming a first black photoresist layer 152 on the touch metal layer 151. Material of the first black photoresist layer 152 can be a low-temperature negative photoresist or a black positive photoresist. The first black photoresist layer 152 is formed on the touch metal layer 151 by a photolithography coating method. Then go on to the step S7.

Step S7: patterning the first black photoresist layer 152 and the touch metal layer 151. Step S7 includes steps below:

exposing and developing the first black photoresist layer 152 with a first mask, and forming the patterned first black photoresist layer 152; and etching the touch metal layer 151, and forming a patterned touch metal layer 151.

Comparing the prior art, the present process does not peel off the first black photoresist 152 after forming the touch metal layer 151 in this step. Using the pattern of the first black photoresist 152 as an insulation layer of the touch metal layer 151 and the bridge layer 154, and blocking the touch metal layer 151, which can reduce the reflection of ambient light and the reflection of the metal lines, and optimize the optical effect. Then go on to the step S8.

Step S8: forming a second flat layer 153 on the second inorganic layer, and the second flat layer 153 covering a patterned first black photoresist layer 151 and a patterned touch metal layer 152. The second flat layer 153 flats the first black photoresist layer 151. The second flat layer 153 is made of organic material.

The patterned touch metal layer 151 includes a plurality of first electrodes 1511 and a plurality of second electrodes 1512. Neighboring two first electrodes 1511 are spaced with each other. Neighboring two second electrodes 1512 are spaced with each other.

After forming the second flat layer 153 in this embodiment, the manufacturing method further includes the steps of:

forming a first hole portion by etching an area of the second flat layer 153 corresponding to the first electrodes 1511 with a second mask;

forming a second hole portion by drily etching an area of the first black photoresist layer 152 and the first electrodes 1511 corresponding to the first hole portion, and the first hole portion connecting the second hole portion to form a first through hole 158.

Then go on to the step S9.

Step S9: forming a bridge layer on the second flat layer. The bridge layer 154 fills the first through hole 158, and neighboring two first electrodes 1511 electrically connect each other through the bridge layer 154. The bridge layer 154 and the first electrode 1511 become a mortise and tenon structure since the first through hole 158 passes through the first electrode 1511 of the touch metal layer 151, which improves the stability.

Material of the bridge layer 154 can be a low-impedance and high-oxidation metal such as TiAlTi or Mo, or can also be a high transmittance conductive material such as indium tin oxide (ITO) or graphene. Then go on to the step S10.

step S10: forming a second black photoresist layer 155 on the bridge layer 154. Material of the second black photoresist layer 155 can be a low-temperature negative photoresist or a black positive photoresist. The second black photoresist layer 155 is formed on the bridge layer 154 by a photolithography coating method. Then go on to the step S11.

Step S11: patterning the second black photoresist layer 155 and the bridge layer 154. Step S11 includes steps below:

exposing and developing the second black photoresist layer 155 with a third mask, and forming the patterned second black photoresist layer 155; and etching the bridge layer 154, and forming the patterned bridge layer 154.

Comparing the prior art, the present process does not peel off the second black photoresist 155 after forming the patterned bridge layer 154 in this step. Using the pattern of the second black photoresist 155 to block the bridge layer 154, which can reduce the reflection of ambient light and the reflection of the metal lines, and optimize the optical effect. Last, the first black photoresist 152 and the second black photoresist 155 form the black shading network 157. The black shading network 157 is disposed between the photoresists of the color filter layer 142. The black shading network 157 replaces the black matrix of the color filter layer 142, and simplify the fabrication of the package structure 14.

The second black photoresist layer 155 is made of organic material and disposed on the upper surface of the bridge layer 154, and the second flat layer 153 is made of organic material and disposed on the lower surface of the bridge layer 154, so that the bridge layer 154 is disposed between two organic layers. When the embodiment is in the bent state, the stress of the bridge layer 154 will be released by the second black photoresist layer 155 and the second flat layer 153, and prevent the bridge layer 154 damage.

Then go on to the step S12.

Step S12: forming a protection layer 156 on the second flat layer 153, and the protection layer 156 covering a patterned bridge layer 154 and a patterned second black photoresist layer 155. Using a fourth mask to form the protection layer 156 on the second flat layer 153.

In the manufacturing method of the display panel of the embodiment of the present invention, it only uses four mask processes to produce the packaging structure and the touch structure of the embodiment. The present invention simplifies the process and reduces the cost.

Comparing the display panels of the prior art, the display panel and a manufacturing method thereof of the present invention integrate the color filter layer into the normal packaging layer to form a packaging structure. First, the present invention thins the display panel. Second, the present invention reduces four mask processes due to the inkjet-printed color filter layer.

In addition, the touch structure of the present invention forms a black shading network with the first black photoresist layer and the second black photoresist layer to block the reflection of the metal lines and the cathode metal. The black shading network is disposed between the photoresists of the color filter layer likes a black matrix, and therefore reducing one mask process. The first black photoresist layer and the second black photoresist layer are respectively disposed on the touch metal layer and the bridge layer like a function that insulate the touch metal layer and the bridge layer, and therefore replacing the insulation layer and reducing a process of peeling off the first black photoresist layer and the second black photoresist layer. Consequently, the present invention solves problems that the complex process and the low efficient of the prior integrated display panel.

Based on the description given above, those having ordinary skills of the art may easily contemplate various changes and modifications of the technical solution and technical ideas of the present invention and all these changes and modifications are considered within the protection scope of right for the present invention.

What is claimed is:

1. A manufacturing method of a display panel, wherein the display panel comprises an organic light-emitting structure layer, the organic light-emitting structure layer comprises red light-emitting pixels, green light-emitting pixels, blue light-emitting pixels, and the manufacturing method comprises a step of forming a packaging structure, the step of forming the packaging structure comprising the steps of:

forming a first inorganic layer on the organic light-emitting structure layer;

forming a color filter layer on the first inorganic layer, the color filter layer comprising a red photoresist, a green photoresist, and a blue photoresist;

forming a first flat layer on the first inorganic layer, and the first flat layer covering the color filter layer; and forming a second inorganic layer on the first flat layer;

wherein the red photoresist is disposed on a light-emitting side of the red light-emitting pixels, the green photoresist is disposed on a light-emitting side of the green light-emitting pixels, and the blue photoresist is disposed on a light-emitting side of the blue light-emitting pixels, and wherein an orthographic projected area of the red light-emitting pixels in a plane of the color filter layer is less than or equal to an orthographic projected area of the red photoresist in the plane of the color filter layer, an orthographic projected area of the green light-emitting pixels in the plane of the color filter layer is less than or equal to an orthographic projected area of the green photoresist in the plane of the color filter layer, and an orthographic projected area of the blue light-emitting pixels in the plane of the color filter layer is less than or equal to an orthographic projected area of the blue photoresist in the plane of the color filter layer; and wherein the manufacturing method further comprises a step of forming a touch structure, the step of forming the touch structure comprising the steps of:

forming a touch metal layer on the second inorganic layer;

forming a first black photoresist layer on the touch metal layer;

patterning the first black photoresist layer and the touch metal layer;

forming a second flat layer on the second inorganic layer, and the second flat layer covering a patterned first black photoresist layer and a patterned touch metal layer;

forming a bridge layer on the second flat layer;

forming a second black photoresist layer on the bridge layer;

patterning the second black photoresist layer and the bridge layer, the first black photoresist layer and the second black photoresist layer forming a black shading network, and the black shading network disposed beyond the red photoresist, the green photoresist, and the blue photoresist of the color filter layer; and forming a protection layer on the second flat layer, and the protection layer covering a patterned bridge layer and a patterned second black photoresist layer.

2. The manufacturing method of the display panel as claimed in claim 1, wherein the color filter layer is formed on the first inorganic layer by an inkjet printing process.

3. The manufacturing method of the display panel as claimed in claim 1, wherein patterning the first black photoresist layer and the touch metal layer comprises the steps of:

exposing and developing the first black photoresist layer with a first mask, and forming the patterned first black photoresist layer; and etching the touch metal layer, and forming a patterned touch metal layer.

4. The manufacturing method of the display panel as claimed in claim 1, wherein the patterned touch metal layer comprises a plurality of first electrodes, and neighboring two first electrodes are spaced with each other; and wherein after forming the second flat layer, the manufacturing method further comprises the steps of:

forming a first hole portion by etching an area of the second flat layer corresponding to the first electrodes with a second mask;

forming a second hole portion by drily etching an area of the first black photoresist layer and the first electrodes corresponding to the first hole portion, and the first hole portion connecting the second hole portion to form a first through hole; and forming the bridge layer on the second flat layer, the bridge layer filling the first through hole, and neighboring two first electrodes electrically connecting each other through the bridge layer.

5. The manufacturing method of the display panel as claimed in claim 1, wherein patterning the second black photoresist layer and the bridge layer comprises the steps of:

exposing and developing the second black photoresist layer with a third mask, and forming the patterned second black photoresist layer; and etching the bridge layer, and forming the patterned bridge layer.

6. The manufacturing method of the display panel as claimed in claim 1, wherein forming the protection layer on the second flat layer with a fourth mask.

7. A display panel, comprising:

an organic light-emitting structure layer, the organic light-emitting structure layer comprising red light-emitting pixels, green light-emitting pixels, and blue light-emitting pixels;

wherein the display panel comprises a packaging structure, and the packaging structure is formed on the organic light-emitting structure layer;

the packaging structure comprising:

a first inorganic layer formed on the organic light-emitting structure layer;

a color filter layer formed on the first inorganic layer, the color filter layer comprising a red photoresist, a green photoresist, and a blue photoresist;

a first flat layer formed on the color filter layer; and a second inorganic layer formed on the first flat layer;

wherein the red photoresist is disposed on a light-emitting side of the red light-emitting pixels, the green photoresist is disposed on a light-emitting side of the green light-emitting pixels, and the blue photoresist is disposed on a light-emitting side of the blue light-emitting pixels; and wherein an orthographic projected area of the red light-emitting pixels in a plane of the color filter layer is less than or equal to an orthographic projected area of the red photoresist in the plane of the color filter layer, an orthographic projected area of the green light-emitting pixels in the plane of the color filter layer is less than or equal to an orthographic projected area of the green photoresist in the plane of the color filter layer, and an orthographic projected area of the blue light-emitting pixels in the plane of the color filter layer is less than or equal to an orthographic projected area of the blue photoresist in the plane of the color filter layer.

8. The display panel as claimed in claim 7, wherein the display panel comprises a touch structure, and the touch structure is formed on the packaging structure;

the touch structure comprising:

a patterned touch metal layer disposed on the second inorganic layer;

a patterned first black photoresist layer disposed on the touch metal layer;

a second flat layer formed on the second inorganic layer and covers the touch metal layer and the first black photoresist layer;

a patterned bridge layer disposed on the second flat layer;

a patterned second black photoresist layer disposed on the bridge layer; and a protection layer formed on the second flat layer and covers the bridge layer and the second black photoresist layer;

wherein the first black photoresist layer and the second black photoresist layer forms a black shading network, and the black shading network disposed beyond the red photoresist, the green photoresist, and the blue photoresist of the color filter layer.

9. The display panel as claimed in claim 8, wherein the touch metal layer comprises a plurality of first electrodes, and neighboring two first electrodes are spaced with each other;
- wherein the touch structure comprises a first through hole, and the first through hole passes through the second flat layer, the first black photoresist layer, and the first electrode; and
- wherein the bridge layer is formed on the second flat layer and fills the first through hole, and neighboring two first electrodes electrically connect each other through the bridge layer.

10. A manufacturing method of a display panel, wherein the display panel comprises an organic light-emitting structure layer, the organic light-emitting structure layer comprises red light-emitting pixels, green light-emitting pixels, blue light-emitting pixels, and the manufacturing method comprises a step of forming a packaging structure, the step of forming the packaging structure comprising the steps of:
- forming a first inorganic layer on the organic light-emitting structure layer;
- forming a color filter layer on the first inorganic layer, the color filter layer comprising a red photoresist, a green photoresist, and a blue photoresist;
- forming a first flat layer on the first inorganic layer, and the first flat layer covering the color filter layer; and
- forming a second inorganic layer on the first flat layer;
- wherein the red photoresist is disposed on a light-emitting side of the red light-emitting pixels, the green photoresist is disposed on a light-emitting side of the green light-emitting pixels, and the blue photoresist is disposed on a light-emitting side of the blue light-emitting pixels; and
- wherein an orthographic projected area of the red light-emitting pixels in a plane of the color filter layer is less than or equal to an orthographic projected area of the red photoresist in the plane of the color filter layer, an orthographic projected area of the green light-emitting pixels in the plane of the color filter layer is less than or equal to an orthographic projected area of the green photoresist in the plane of the color filter layer, and an orthographic projected area of the blue light-emitting pixels in the plane of the color filter layer is less than or equal to an orthographic projected area of the blue photoresist in the plane of the color filter layer.

11. The manufacturing method of the display panel as claimed in claim 10, wherein the color filter layer is formed on the first inorganic layer by an inkjet printing process.

12. The manufacturing method of the display panel as claimed in claim 10, wherein the manufacturing method further comprises a step of forming a touch structure, the step of forming the touch structure comprising the steps of:
- forming a touch metal layer on the second inorganic layer;
- forming a first black photoresist layer on the touch metal layer;
- patterning the first black photoresist layer and the touch metal layer;
- forming a second flat layer on the second inorganic layer, and the second flat layer covering a patterned first black photoresist layer and a patterned touch metal layer;
- forming a bridge layer on the second flat layer;
- forming a second black photoresist layer on the bridge layer;
- patterning the second black photoresist layer and the bridge layer, the first black photoresist layer and the second black photoresist layer forming a black shading network, and the black shading network disposed beyond the red photoresist, the green photoresist, and the blue photoresist of the color filter layer; and
- forming a protection layer on the second flat layer, and the protection layer covering a patterned bridge layer and a patterned second black photoresist layer.

13. The manufacturing method of the display panel as claimed in claim 12, wherein patterning the first black photoresist layer and the touch metal layer comprises the steps of:
- exposing and developing the first black photoresist layer with a first mask, and forming the patterned first black photoresist layer; and
- etching the touch metal layer, and forming a patterned touch metal layer.

14. The manufacturing method of the display panel as claimed in claim 12, wherein the patterned touch metal layer comprises a plurality of first electrodes, and neighboring two first electrodes are spaced with each other; and
- wherein after forming the second flat layer, the manufacturing method further comprises the steps of:
- forming a first hole portion by etching an area of the second flat layer corresponding to the first electrodes with a second mask;
- forming a second hole portion by drily etching an area of the first black photoresist layer and the first electrodes corresponding to the first hole portion, and the first hole portion connecting the second hole portion to form a first through hole; and
- forming the bridge layer on the second flat layer, the bridge layer filling the first through hole, and neighboring two first electrodes electrically connecting each other through the bridge layer.

15. The manufacturing method of the display panel as claimed in claim 12, wherein patterning the second black photoresist layer and the bridge layer comprises the steps of:
- exposing and developing the second black photoresist layer with a third mask, and forming the patterned second black photoresist layer; and
- etching the bridge layer, and forming the patterned bridge layer.

16. The manufacturing method of the display panel as claimed in claim 12, wherein forming the protection layer on the second flat layer with a fourth mask.

* * * * *